United States Patent [19]

Tuller et al.

[11] Patent Number: 5,509,189
[45] Date of Patent: Apr. 23, 1996

[54] METHOD FOR MAKING AN ELECTROCHEMICAL CELL

[75] Inventors: Harry L. Tuller, Wellesley; Steve A. Kramer, Somerville; Marlene A. Spears, Woburn; Uday B. Pal, Needham, all of Mass.

[73] Assignee: Massachusetts Institute of Technology, a MA corp., Cambridge, Mass.

[21] Appl. No.: 356,888

[22] Filed: Dec. 15, 1994

Related U.S. Application Data

[62] Division of Ser. No. 29,159, Mar. 10, 1993, Pat. No. 5,403,461.

[51] Int. Cl.$^6$ .................................................. H01M 6/00
[52] U.S. Cl. .................. 29/623.1; 264/60; 264/109; 117/940; 117/947; 117/103; 117/108; 419/10; 419/19; 419/61; 427/115; 427/77; 427/126.3; 427/126.5; 427/248.1
[58] Field of Search ................ 264/22, 60, 109; 419/19, 10, 61; 427/248.1, 115, 126.3, 126.5, 126.6; 117/940, 947, 88, 103, 108; 501/12; 29/623.1, 623.3, 623.5

[56] References Cited

U.S. PATENT DOCUMENTS

| | | | |
|---|---|---|---|
| 4,233,142 | 11/1980 | Rohr et al. | 204/195 S |
| 4,412,904 | 11/1983 | Rohr et al. | 204/424 |
| 4,562,124 | 12/1985 | Ruka | 429/33 |
| 4,799,936 | 1/1989 | Riley | 29/623.1 |
| 4,957,673 | 9/1990 | Schroeder et al. | 264/60 |
| 5,055,440 | 10/1991 | Chu et al. | 502/303 |
| 5,093,301 | 3/1992 | Chu et al. | 502/303 |
| 5,143,801 | 9/1992 | Bates | 429/33 |
| 5,171,645 | 12/1992 | Khandkar | 429/33 |
| 5,175,064 | 12/1992 | Labinger et al. | 429/40 |
| 5,298,235 | 3/1994 | Worrell et al. | 429/33 |

FOREIGN PATENT DOCUMENTS

| | | |
|---|---|---|
| 0514842A1 | 5/1992 | European Pat. Off. . |
| 1288759 | 11/1989 | Japan . |
| WO92/12106 | 7/1992 | WIPO . |

OTHER PUBLICATIONS

Singer et al. New Solid Conductors of $Na^+0$ $K^+$ Fong, National Aeronautics and Space Administration, Lewis Research Center Cleveland, Ohio pp. 614–617 May 1976.

J. B. Goodenough et al., "Oxide ion electrolytes", Materials Science and Engineering, B12, (1992), pp. 357–364. No Month Available.

B. C. H. Steele, "Oxygen ion conductors and their technological applications", Materials Science and Engineering, B13, (1992), pp. 79–87. No Month Available.

H. L. Tuller et al., "Doped Ceria as a Solid Oxide Electrolyte", Journal of the Electrochemical Society, 122, (1975), pp. 255–259.

T. G. Stratton et al., "Thermodynamics and Transport Studies of Mixed Oxides:$CeO_2$–$UO_2$ System", J. Chem. Soc. Faraday Trans. 2, 83, (1987), pp. 1143–1156. No Month Available.

*Primary Examiner*—Kathryn Gorgos
*Attorney, Agent, or Firm*—Florence Fusco McCann

[57] ABSTRACT

An electrochemical device including a solid electrolyte and solid electrode composed of materials having different chemical compositions and characterized by different electrical properties but having the same crystalline phase is provided. A method for fabricating an electrochemical device having a solid electrode and solid electrolyte characterized by the same crystalline phase is provided.

24 Claims, 8 Drawing Sheets

METHOD FOR MAKING AN ELECTROCHEMICAL CELL

The United States government has rights in this invention based on grant DE-FG02-86ER45261 from the Department of Energy.

This is a divisional of application Ser. No. 08/029,159 filed on Mar. 10, 1993, now U.S. Pat. No. 5,403,461.

BACKGROUND OF THE INVENTION

1. Field of the Invention

The invention relates to a solid electrolyte-electrode system for use in an electrochemical cell. More particularly, the invention relates to a solid oxide electrolyte-electrode system for use in a solid state electrochemical cell.

2. Description of the Prior Art

Electrochemical devices, particularly solid state electrochemical devices such as those used for energy conversion and storage, gas sensing, and gas separation and purification require optimized and compatible solid electrolyte and electrode materials. Different, specific demands are placed on the electrical conductivity properties of electrolyte and electrode materials making up those devices.

The total conductivity of a material, due to both ionic and electronic charge carriers, is equal to the sum of its ionic and electronic conductivity. The fraction of the total conductivity carried by ions is referred to as the ionic transference number and the fraction of the total conductivity carried by electrons is referred to as the electronic transference number.

Solid electrolyte materials should be primarily ionically conductive and have ionic transference numbers close to unity and have electronic transference numbers close to zero to avoid cell discharge under open circuit conditions due to gas permeation. Ionic conductivity should be high to maximize cell voltage and minimize resistive losses. Typically, electrolytes meeting the above criteria and having sufficiently high conductivities to be useful in practical electrochemical devices have oxygen ions or hydrogen ions, protons, as the ionically conductive species. For oxygen ion conductor solid electrolyte materials, the ionic transference number must remain near unity over a wide range of oxygen concentrations as measured usually in terms of oxygen partial pressure. Furthermore, the electrolyte must be chemically and mechanically stable over the service temperatures at which the electrochemical device is to operate.

Solid electrodes, like solid electrolytes, must be chemically and mechanically stable at electrochemical device service temperatures and device environments. Additionally, solid electrodes must be chemically compatible with the solid electrolytes with which they are used to avoid formation of chemical reaction products which can compromise electrochemical device operation.

Special requirements are placed on solid electrodes used in fuel cells where oxidation and reduction reactions occur respectively at the anode and cathode electrodes. In order to achieve rapid reaction kinetics and avoid losses caused by overpotentials at the electrodes, ionic and electronic carrier species and gas phase species must be rapidly supplied to or removed from the electrode/electrolyte interface. Rapid kinetics and loss prevention is accomplished either by using electronically conductive electrodes with sufficient porosity to allow gas molecules to reach the three phase (electrolyte-reactant-electrode) interface or preferably by using an electrode characterized by mixed ionicelectronic conduction (MIEC) whose surface is everywhere catalytically active.

Conventional electrochemical cells typically use stabilized zirconia (e.g. $ZrO_2$ stabilized with 9 mol % $Y_2O_3$) as the solid electrolyte because of its excellent stability with respect to oxidation and reduction and high oxygen ion conductivity ($\sigma=10^{-1}$ S/cm at 1000° C.) along with doped $LaMnO_3$, and doped $LaCrO_3$ and $Ni$—$ZrO_2$ cermet solid electrode materials. When the electrochemical device is a fuel cell, perovskite crystal structured $LaMnO_3$ $LaCrO_3$ oxides serve as the air electrode and interconnect and a $Ni$—$ZrO_2$ cermet is the fuel electrode. Such conventional zirconia based electrolyte and electrode systems are described in Japanese Patent No. JP 1288759 dated Nov. 21, 1989; U.S. Pat. No. 4,233,142 to Rohr et al., issued Nov. 11, 1980; and U.S. Pat. No. 4,412,904 to Rohr et al., issued Nov. 1, 1983.

Conventional zirconia electrolyte based electrochemical cells have several limitations among which are the following. Efficient cell operation is limited to approximately 900°–1000° C. resulting from the high oxygen ion conductivity activation energy of 0.9–1.0 ev characteristic of zirconia based materials which results in sharply decreasing electrolyte ionic conductivity with temperature and interfacial electrode resistance which rapidly increases at low temperature. Furthermore, the cell lifetime of a zirconia electrolyte based cell is limited as a result of chemical reactions between the zirconia electrolyte and the $LaMnO_3$ and $LaCrO_3$ electrodes to form resistive intermediate phases; cracking due to thermal-mechanical stresses that arise between the different materials in contact at the electrolyte-electrode interface; densification of porous electrodes thus limiting gas access to and removal from the electrolyte-electrode interface; and aging of the non-equilibrium cubic fluorite phase of stabilized zirconia resulting in ordering and trapping of the oxygen charge carriers thereby resulting in reduced electrolyte conductivity.

Thus, there exists a need for a stable electrolyte-electrode system capable of operating at temperatures in the range at from about 900°–1000° C. or preferably lower than the operating range of conventional zirconia electrolyte-based technology; minimizing stability difficulties resulting from chemical reactions and thermal mechanical stresses between the different compounds and aging of the electrolyte; and exhibiting enhanced electrode kinetics.

SUMMARY OF THE INVENTION

The invention provides an electrochemical apparatus which includes a solid electrolyte in electrical contact with a solid electrode having the same crystalline phase as the solid electrolyte.

In another aspect of the invention, a method is provided for fabricating an electrochemical device which includes preparing a solid electrolyte having a first crystalline phase and placing this solid electrolyte in electrical contact with a solid electrode having the same crystalline phase.

Objects of the invention include providing an electrochemical device operating at lower temperatures than conventional electrolyte-electrode systems, having enhanced resistance to chemical instability resulting from chemical reactions and mechanical instability resulting from thermal expansion coefficient and lattice parameter mismatch between the differing compounds making up the electrode and electrolyte, resisting electrolyte aging and exhibiting enhanced electrode kinetics.

A further object of the invention is provision of a method for preparing an electrochemical device including a solid electrolyte and solid electrode having the same crystalline phase thus allowing for simplified processing since a single crystalline phase is used for the solid electrode and electrolyte cell components with the ability to compositionally grade the electrochemical apparatus by providing compositionally graded layers between the solid electrolyte and solid electrode thereby further minimizing thermal-mechanical stresses within the electrochemical apparatus.

Other and further objects, features and advantages of the present invention will be readily apparent to those skilled in the art in reading the description of preferred embodiments which follows.

DETAILED DESCRIPTION OF THE INVENTION

The invention provides an electrochemical apparatus which includes a solid electrolyte in electrical contact with a solid electrode having the same crystalline phase as the solid electrolyte. As used herein in the specification and claims, the term crystalline phase refers to a solid with a given crystal structure or its derivatives formed by an order-disorder process or impurity or defect introduction. The crystalline phase, while often single phase may be multiphase wherein there exists a mixture of the given structure with its derivatives and/ or between its derivatives. This definition holds even if minority phases with different structures are formed in the above mixtures.

The solid electrolyte and solid electrode can be respectively characterized by a solid electrolyte lattice constant and a solid electrode lattice constant as well as by a lattice constant mismatch which is a measure of the difference between the solid electrolyte lattice constant and the electrode lattice constant. Typically, the lattice constant mismatch is in the range of from about 0.1% to about 5%, more preferably in the range of from about 0.05% to about 2% and most preferably in the range of from about 0 to about 0.7%. The electrochemical apparatus is configured as a monolithic graded structure which further includes regions of graded composition including gradations in composition between the composition of the solid electrode and of the solid electrolyte, and is, therefore, also characterized by gradation in the lattice constant corresponding to the gradation in composition of the graded region in order to minimize the lattice constant mismatch between the solid electrolyte lattice constant and the solid electrode lattice constant. It is also characterized by a gradation in the coefficient of thermal expansion which further limits stresses built up at interfaces between solid electrolyte and solid electrode layers having differing chemical compositions during temperature excursions to which the apparatus is subjected during operation.

Ionic conductivity is an activated, Arrhenius process characterized by an ionic conductivity activation energy which can be in the range of from about 1.5 ev to about 0.5 ev, more preferably in the range of from about 0.9 ev to about 0.5 ev and most preferably in the range of from about 0.7 ev to about 0.5 ev.

The solid electrode can be characterized by an electronic conductivity in the range from about $10^{-3}$ S/cm to about $10^3$ S/cm more preferably in the range of from about $10^{-1}$ S/cm to about $10^3$ S/cm, and most preferably in the range of from about 10 S/cm to about $10^3$ S/cm.

The electrochemical apparatus can further include a solid interconnect characterized by predominantly electronic conductivity in the range of from about 1 S/cm to about $10^{-3}$ S/cm. Interconnects in a fuel cell, for example must display stability in both oxidizing and reducing atmospheres and have high electronic conductivity to minimize permeation between the anode and the cathode.

In a preferred embodiment, the solid electrode is characterized by mixed ionic and electronic conductivity (MIEC) and simultaneously displays an ionic conductivity of from about $10^{-3}$ S/cm to about 1 S/cm, more preferably in the range of from about $10^{-2}$ S/cm to about 1 S/cm, and most preferably in the range of from about $10^{-1}$ S/cm to about 1 S/cm along with an electronic conductivity in the range from about $10^{-3}$ S/cm to about $10^3$ S/cm, more preferably in the range of from about $10^{-1}$ S/cm to about $10^3$ S/cm, and most preferably in the range of from about 10 S/cm to about $10^3$ S/cm.

The apparatus can further include a solid interconnect characterized by a predominantly electronic conductivity in the range of from about 1 S/cm to about $10^3$ S/cm.

The solid electrolyte and solid electrode crystalline phase can be a solid solution having a crystalline phase with a cation or multiple cation lattices which accommodate various isovalent or aliovalent substitutions as well as and/or ranges of cation and anion non-stoichiometry and are also capable of accommodating cations of different sizes which affect electrical properties through disordering the cation lattice and having electrical properties which can be controllably varied by varying solid solution composition so that materials of the same crystalline phase characterized alternatively by ionic conductivity, electronic conductivity, and mixed ionic and electronic conductivity (MIEC) can be produced to be used, respectively as solid electrolyte, interconnect and solid electrode components of the electrochemical apparatus. The solid solution can be characterized by the formula $(A_{1-j}D_j)_x (B_{1-k}E_k)_y O_z X_w$, where A is a cation of an element such as Ca, Sr, Ba, Sc, Y, La, Ce, Pr, Nd, Sm, Eu, Gd, Tb, Dy, Ho, Er, Tm, Yb, Lu, Tl, Pb, Bi, Pm and mixtures thereof: B is a cation of an element such as Al, Cr, Mn, Fe, Co, Ni, Cu, In, Ti, Zr, Hf, Sn, Pb, Ru, Os, Ir, Rh, Pd, Pt, Sb, V, Nb, Ta, Mo, W and mixtures thereof; D is a cation of an element such as Na, K, Ca, Sr, Ba, Sc, Y, La, Ce, Pr, Nd, Sm, Eu, Gd, Tb, Dy, Ho, Er, Tm, Yb, Lu, Tl, Pb, Bi and Pm; E is a cation of an element such as Al, Sc, Cr, Mn, Fe, Co, Ni, Cu, In, Ti, Zr, Hf, Sn, Pb, Ru, Os, Ir, Rh, Mo, W Pd, Pt, Sb, V, Nb and Ta; O is oxygen; X is an anion of an element such as S, N, F, Cl, or OH; x is in the range of $0 < x < 5$; j is in the range $0 \leq j < 1$; y is in the range $0 < y < 5$; k is in the range $0 \leq k < 1$; z is in the range $2 < z < 11$; w is in the range $0 \leq w < 1$; and x, j, y, k, z, and w are selected to satisfy overall electroneutrality conditions for the formula.

In a preferred embodiment, the solid solution can be a solid solution characterized by a pyrochlore crystal structure of the formula $A_2Ti_2O_{7-\delta}$ where A can be a cation of an element such as Sm, Gd, Ho, Ce, Pr, Nd, Pm, Eu, Tb, Dy, Er, Tm, Yb, Lu, Y, Bi or Pb and δ indicates the degree of non-stoichiometry, i.e. the extent of oxygen deficiency or excess relative to seven oxygens per formula unit, with δ in the range of from about ±0.001 to about ±0.3, more preferably in the range of from about ±0.001 to about ±0.2 and most preferably in the range of from about ±0.01 to about ±0.01.

Advantages of the pyrochlore system include flexibility in controlling the relative level of ionic and electronic conductivity in this system. It is possible, by compositional control, to achieve high ionic conductivity and low electronic conductivity for the solid electrolyte, and high MIEC for the electrodes and high electronic conductivity and low ionic conductivity for the interconnect in the same pyrochlore structure in which the electrodes (air and fuel), the interconnect and the electrolyte are made from the same materials system. Any residual stresses remaining due to small lattice mismatches between the components can be largely eliminated by compositional grading as is often utilized in the semiconductor industry.

The electrical properties of the rare earth titanate pyrochlore crystal structure solid solution can be varied and controlled by varying the identity of the A cation. The A cation has an A cation valence and can be partially replaced by a first dopant cation which has a first dopant cation valence lower than the A cation valence. In a preferred embodiment, the A cation is a $Gd^{3+}$ cation and the first dopant cation is a $Ca^{2+}$ cation and the titanate solid solution has the formula $(Gd_{1-j}Ca_j)_2 Ti_2O_{7-\delta}$ wherein j is the range of from about 0 to 0.25, more preferably in the range of from about 0.0025 to about 0.15, and most preferably in the range of from about 0.02 to about 0.10 and δ=j/2 to increase the ionic conductivity of the titanate solid solution solid electrolyte. The ionic conductivity can also be increased by substituting a lower valent ion such as $Al^{3+}$ on the $Ti^{4+}$ site. The ionic conductivity of the titanate solid solution solid electrolyte can be also be increased by partially replacing the A cation with a smaller isovalent cation such as $Dy^{3+}$, $Y^{3+}$ or $Ho^{3+}$. Yet another way to increase the conductivity of the rare earth titanate solid solution solid electrolyte is by partially replacing Ti with a larger, isovalent cation such as $Zr^{4+}$, $Sn^{4+}$ or $Hf^{4+}$.

It is also possible to increase the electronic conductivity of the rare earth titanate solid solution solid electrode by partially replacing Ti with a donor cation such as $Nb^{5+}$, $W^{6+}$, $Mo^{6+}$, $Ta^{5+}$ or $V^{5+}$. The A cation can be also be replaced by a second dopant cation having a second dopant cation valence higher than the A cation valence such as $Th^{4+}$, $U^{5+}$, $Pr^{4+}$, $Tb^{4+}$ or $Ce^{4+}$ to increase the electronic conductivity of the solid electrode.

In the formula $A_2Ti_2O_{7-\delta}$, Ti can be partially replaced by an acceptor dopant cation which is characterized by an equilibrium concentration of the ion in more than one cationic valence state such as, a Ru cation which maintains equilibrium among the $Ru^{4+}$, $Ru^{3+}$, and $Ru^{2+}$ states. Other acceptor dopant cations include cations of the elements Os, Ir, Rh, Pd, Pt and Re which are characterized by extended orbital states and result in metallic oxides or semiconducting oxides with very narrow bandgaps therefor. They can be used for solid electrodes simultaneously exhibiting mixed ionic and electronic conductivity (MIEC).

The solid electrolyte and solid electrode can also be made of a crystalline phase which is a solid solution characterized by a perovskite-derived crystal structure and having the formula $AB_4O_{3-\delta}$ where A is an a cation of an element such as Ba, Sr, La and Ca; B is a cation of an element such as Ti, Zr, Co, Ni, Sr, Mn, Cu, Fe, In, Mg, Zn, Sc, Ta, Nb and Al and δ is in the range of from 0 to about 3.

The chemical composition of the perovskite derived crystal structure solid solution can be controlled to produce a solid electrode and a solid electrolyte having optimized electronic conductivity and ionic conductivity, respectively. The ionic conductivity of the solid electrolyte can be increased by partially replacing the A and/or B cation by a third dopant cation having a valence which is lower than the A and/on B cation valence respectively. The A cation can be partially replaced by a cation such as a cation of an element such as K, Ca, Mg, Sr or Na. The B cation can be partially replaced by a lower valent cation of an element such as Al, Zn, Mg, In or Sc. Finally, the ionic conductivity of the solid electrolyte can also be increased by partially replacing the B cation by a cation with a higher charge such as $Zr^{4+}$, $Ce^{4+}$, $Hf^{4+}$ or $Th^{4+}$.

The n-type electronic conductivity of the solid electrodes can be increased by partially replacing the A and/or B cation with a donor cation such as $Nb^{5+}$, $Ta_{5+}$, $W^{6+}$, $V^{5+}$, $Mo^{6+}$, $Th^{4+}$, $Pr^{4+}$, $Tb^{4+}$ and trivalent rare earth cations. The mixed ionic and electronic conductivity (MIEC) of a solid electrode can be simultaneously increased by partially replacing the B cation with a second acceptor dopant cation of an element such as Fe, Co, Ni, Cr, Mn, Cu, Ru, Os, Ir, Rh, Pd, Pt or Re.

Suitable perovskite related solid solution systems are systems of the $A_2B_2O_5$ type such as $Ca_2(Al_kFe_{1-k})_2O_5$ and $Sr_2(Al_kFe_{1-k})_2O_5$, as well as solid solutions of the $A_3B_2BO_8$ type such as $Ba_3\{(In_{1-k}Fe_k)_2Zr\}O_8$, $Ba_3(In_2(Zr_{1-2k}Ti k_2)\}O_8$ wherein, refers to the B cation $(Ca_2Y)$ $(Fe_{1-k}Alk_3)O_8$ and $Ca_3Fe_2Ti)O_8$ and solid solutions of the type $ABO_3'$ e.g. $(La_{1-j}Sr_j)$ $(Al_{1-k}Mnk)O_3$.

The solid electrolyte and solid electrode in another preferred embodiment can be made from a solid solution characterized by a fluorite crystal structure and by the formula $A_{1-j}D_jO_{2\pm\epsilon}$ wherein A is a cation of an element such as Ce, Hf, Zr, or Th and D is a cation of an element such as U, Zr, Hf, Th, Pr and Tb and $\epsilon$ indicates the degree of nonstoichiometry, i.e. the extent of oxygen deficiency or oxygen excess relative to two oxygens per formula unit and is the range of from about 0 to about +0.3, more preferably in the range of from about 0 to about 0.1, and most preferably in the range of from about 0 to about 0.03.

The electrical properties, i.e. electronic and ionic conductivity, respectively, of a solid electrode and a solid electrolyte made from a solid solution crystalline phase having fluorite crystal structure and characterized by the formula $A_{1-j}D_jO_{2\pm\epsilon}$ can be optimized by controlled variation of the composition of the fluorite crystal solid solution.

The ionic conductivity of the solid electrolyte can be increased by partially replacing the A cation by a fourth dopant cation having a valence lower than the A cation valence such as a cation of the elements including Y, Ca, La, Gd or Nd.

The electronic conductivity of the solid electrolyte can be increased by partially replacing the A cation by a donor cation of an element such as U, Ta or Nb.

Finally, the electronic conductivity of the solid electrode can be increased by selecting an D cation capable of simultaneously increasing mixed ionic and electronic conductivity (MIEC), such as Ce in $ThO_2$ with energy levels in the bandgap of the fluorite crystal structure solid solution material making up the solid electrode and thus forming impurity bands within the bandgap of the solid electrode material. Ionic conductivity is increased by reduction of $Ce^{4+}$ to $Ce^{3+}$. Other suitable dopants include Pr and Tb cations.

For example, high electronic conductivity can be produced in $CeO_2$ by the addition of uranium into solid solution. $Ce_{0.95}U_{0.05}O_2$ exhibits an electronic conductivity of greater than 1 S/cm at 1000° C. between $10^{-16}$ atm$<P_{o2}<1$ atm. On the other hand, yttria-doped $CeO_2$ is an excellent oxygen ion conductor having an ionic conductivity of $10^{-1}$ S/cm at 1000° C. A graded structure of $CeO_2$: U/$CeO_2$: Y/$CeO_2$: U can be used as a fuel cell element. Undoped $CeO_2$ can also be used as a solid electrode under reducing conditions where it exhibits n-type conductivity due to reduction to $CeO_{2-x}$.

The solid electrode and solid electrolyte can be formed from a crystalline phase which can be a single crystal phase or a polycrystalline phase.

The electrochemical apparatus can be a graded solid oxide fuel cell having a solid oxide anode layer made of anode material characterized by a first crystalline phase; a solid oxide electrolyte layer made of electrolyte material characterized by the same first crystalline phase; a solid oxide cathode layer made of cathode material and characterized by the same first crystalline phase; a first graded region separating the solid oxide anode layer from the solid oxide electrolyte layer and a second graded region separating the solid oxide electrolyte layer from the solid oxide cathode layer.

The solid oxide anode layer, solid electrolyte layer, solid oxide cathode layer, first graded region and second graded region are, respectively, characterized by a solid oxide anode layer composition, a solid oxide electrolyte layer composition, a solid oxide cathode layer composition, a first graded region composition and a second graded region composition. The first graded layer has a first graded layer/electrolyte interface and a first graded layer/anode interface and has a spatially graded composition which varies from the solid oxide anode layer composition at the first graded layer/anode interface to the solid oxide electrolyte layer composition at the first graded layer/electrolyte interface. The second graded layer also has a second graded layer/cathode interface where the second graded layer contacts the solid oxide cathode. The second graded layer has a spatially graded composition which varies from the solid oxide electrolyte composition at the second graded layer/electrolyte interface to the solid oxide cathode composition at the second graded layer/cathode interface.

An interconnect to connect one electrochemical device with another electrochemical device can also be provided. The interconnect is in electrical contact with the solid electrode and a compositionally graded layer can be provided between the interconnect and the solid electrode to allow for a gradual composition change between the solid electrode and interconnect materials and, hence, a gradual change in thermal expansion and electrical properties, as well.

The thickness of the graded layers and the degree of steepness of the compositional grading will depend upon the extent of lattice parameter mismatch and thermal expansion coefficient mismatch existing between the neighboring material layers which have been selected on the basis of their electrical properties and suitability to function as a particular electrochemical device component.

The monolithic graded solid oxide fuel cell can be configured to utilize the advantageous properties of a solid oxide electrolyte and solid oxide electrode made of material having the same crystalline phase.

Figure 1:
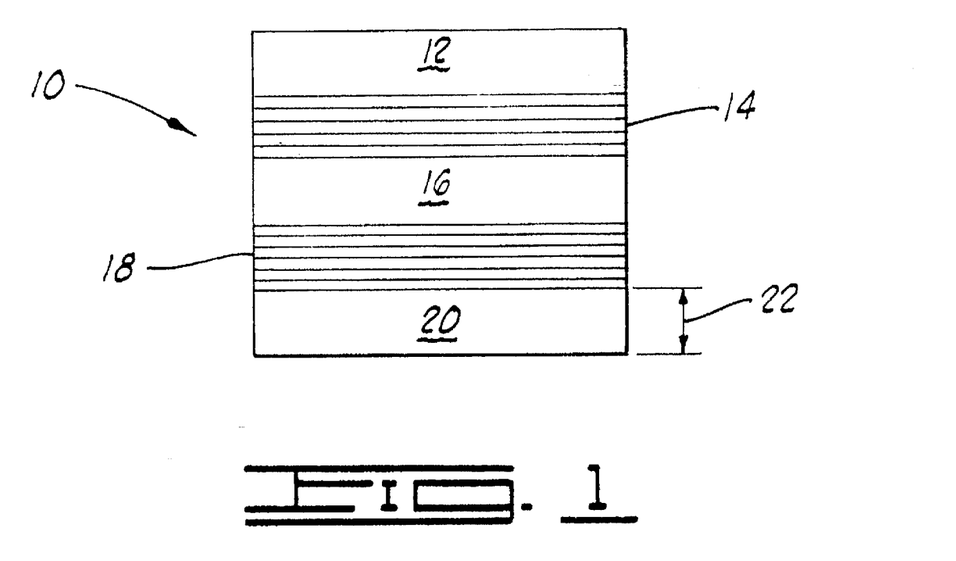
FIG. 1 is a schematic cross-section of a solid oxide fuel cell including a graded region.

FIG. 1 shows solid oxide fuel cell 10 wherein cathode layer 12, second graded region 14, solid oxide electrolyte layer 16, first graded region 18 and solid oxide anode 20 each have approximately equal thicknesses 22.

Figure 2:
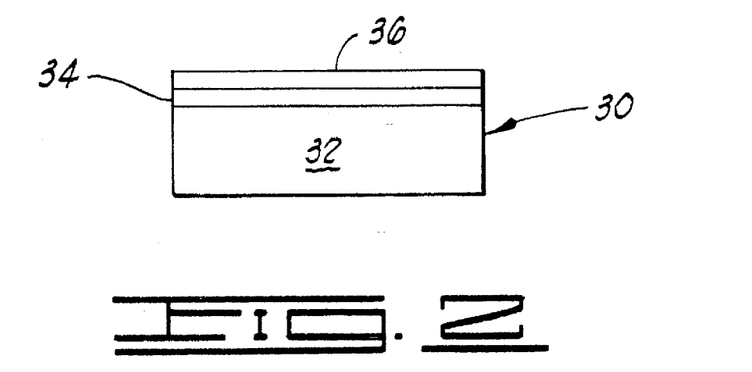
FIG. 2 is a schematic cross-section of a solid oxide fuel cell including a very thin solid oxide electrolyte and solid oxide cathode layer.

In a second preferred embodiment, as shown in the schematic cross-sectional view of a solid oxide fuel cell of FIG. 2, solid oxide fuel cell 30 includes anode layer 32 covered by a very thin solid oxide electrolyte layer 34 which can be as thin as approximately 100 Angstroms and cathode layer 36 as the outer layer of the "sandwich-like" solid oxide fuel cell structure.

Figure 3:
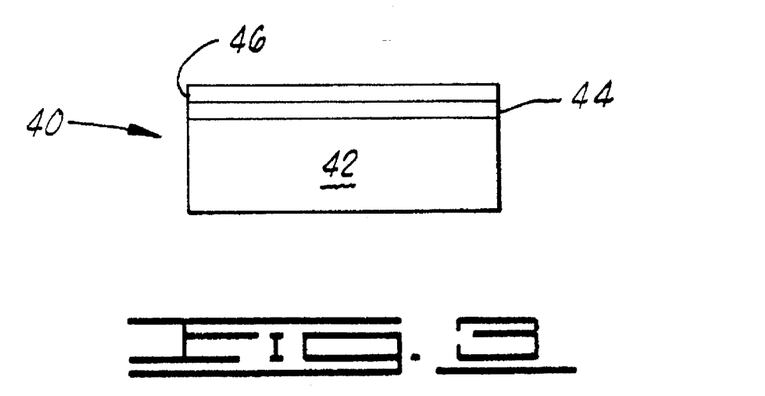
FIG. 3 is a schematic cross-section of a solid oxide fuel cell including a very thin solid oxide electrolyte and solid oxide anode layer.

FIG. 3 shows another schematic cross-sectional view of a solid oxide fuel cell 40 having cathode layer 42 in electrical contact with solid oxide electrolyte layer 44. Layer 44 is in turn in electrical contact with anode layer 46.

The use of the same crystalline phase for the solid oxide electrode and solid oxide electrolyte layers of an electrochemical cell such as a solid oxide fuel cell endows the cell with characteristics of extended life and ease of fabrication since the crystalline phase can be compositionally and, thus, structurally (i.e. with respect to lattice parameter) and functionally, (i.e. with respect to electrical and thermal expansion properties) graded to provide electrolyte and electrode layers which are assembled in a single monolithic structure without sharp interfaces existing between electrolyte and electrode layers. Such a structure also allows for fabricating a very thin electrode as shown schematically in FIGS. 2 and 3 thus minimizing solid electrolyte resistance which often dominates the overall resistance of the electrochemical device. Such a very thin electrolyte having minimized resistance can be structurally supported by an electrode, such as an anode or cathode as shown, respectively, in FIGS. 2 and 3, while the other electrode, respectively, the cathode or the anode is kept thin, since the structurally supporting electrode which can be porous is characterized by considerably lower resistance than the electrolyte. Resistivity in the plane of the various layers as well as resistivity perpendicular to the plane of the layers must be considered in selecting layer thickness.

According to another aspect of the invention, a method is provided for fabricating an electrochemical device which includes steps of preparing a solid electrolyte having a first crystalline phase, preparing a solid electrode characterized by the same crystalline phase and placing the solid electrolyte in electrical contact with the solid electrode.

The crystalline phase can be a solid solution having a pyrochlore, perovskite or fluorite crystal structure as already described.

The steps of preparing the solid electrode and solid electrolyte can be accomplished using ceramic processing techniques such as tape casting and powder processing. Powder processing techniques can include conventional bulk powder processing as well as "liquid-mix" techniques such as the Pechini process, as known to one skilled in the art, and can include selectively doping the crystalline phase to have a particular chemical composition to result in the desired electrical properties.

In addition, solid electrolyte and solid electrode layers can also be prepared using deposition techniques such as electrochemical vapor deposition (EVD), chemical vapor deposition (CVD), molecular beam epitaxy (MBE) or a sol-gel dipping/spinning and sintering process. For example, the solid oxide fuel cell 30 shown schematically in FIG. 2 can be prepared by tape casting anode 32 and depositing electrode layer 34 and cathode layer 36 using EVD or sol-gel dipping/spinning techniques. Graded regions 14 and 18 as shown in FIG. 1 can be prepared by repeatedly sol-gel dipping anode 20 in sol-gel solutions having slightly varying compositions to correspond to the desired spatial composition gradient of graded layers 14 and 18. Using this repeated sol-gel dipping technique, an additional dopant cation F can be introduced in the graded region so that its composition increases from essentially 0 near the solid electrolyte to a particular desired concentration at the electrode.

Suitable sol-gel solution precursors for the rare earth titanate pyrochlore crystal phase solid solution are metal alkoxides and metal beta-diketonates as are well known in the art of sol-gel fabrication.

Appropriate chemical vapor deposition (CVD) precursors useful for fabricating rare earth titanate pyrochlore crystal structure solid solution compositions are $CaCl_2$, $GdCl_3$, $TiCl_4$, $ZrCl_4$ and $O_2/H_2O$ mixtures. Graded regions 14 and 18 as shown in FIG. 1 can be prepared by varying with time e.g. the partial pressure of a CVD gaseous precursor such as $CaCl_2$ or $ZrCl_4$ to create a composition gradient as is accomplished in the production of gradient index optical fibers. High partial pressures of e.g. $CaCl_2$ will lead to high ionic conductivity while low pressures of this precursor will lead to mixed conduction.

Appropriate electrochemical vapor deposition (EVD) precursors for the rare earth titanate pyrochlore crystal structure solid solution are $CaCl_2$, $GdCl_3$, $TiCl_4$, $ZrCl_4$ and $O_2/H_2O$ mixtures. Graded regions 14 and 18 as shown in FIG. 1 can be prepared by varying with time, for example, the partial pressure of an EVD gaseous precursor such as one of those named above to create a composition gradient with a highly controlled composition profile. The EVD process further enables the fabrication of thin but dense films.

The solid oxide electrolyte can be single crystal or polycrystalline and a graded region can be produced in the solid oxide electrolyte by depositing a dopant layer on the solid oxide electrolyte and heating the solid oxide electrolyte so that the dopant layer diffuses into the solid oxide electrolyte to form a graded region.

In a preferred embodiment, the method of fabricating a graded solid oxide fuel cell can include additional steps of masking, deposition and etching to define a precise topography of active regions including electrolyte, anode, cathode, interconnect, metallization and encapsulation regions. The method of fabricating a graded solid oxide fuel cell can also include additional steps of masking the solid electrolyte surface, depositing an anode layer characterized by an anode dopant on the unmasked electrolyte surface; masking the anode layer; unmasking the electrolyte surface originally masked and depositing a cathode on that electrolyte surface.

In order to further illustrate the present invention, the following examples are provided. The particular compounds and processes and conditions utilized in the examples are meant to be illustrative of the present invention and not limiting thereto.

The following example is provided to illustrate trends in ionic conductivity, electronic conductivity and mixed ionic and electronic conductivity (MIEC) in rare earth titanate pyrochlore solid solutions which can be utilized to fabricate monolithic electrochemical devices having an electrode and electrolyte made from material having the same crystalline phase according to the invention.

EXAMPLE 1

Sample preparation of the rare earth titanate pyrochlore materials for use as solid electrodes and solid electrolytes was performed by preparing homogeneous oxide powders having the appropriate compositions followed by sintering the powders into high density compacts.

Powder preparation was conducted using a "liquid-mix" technique known to those skilled in the art as the Pechini process. Such a "liquid-mix" technique is highly desirable since it allows for preparation of a well-defined cation mole ratio with near atomic scale mixing.

According to the Pechini method, a compound of the desired metal is dissolved in a citric acid-ethylene glycol mixture. One such solution is made for each of the desired metal compounds. These solutions are then assayed and mixed in the required proportions to produce the desired oxide compound.

The mixed solutions are heated to condense the acid and alcohol groups which react via a dehydration reaction to form a crosslinked polyester.

The crosslinked polyester polymer mass is then further heated to drive off water and excess ethylene glycol and generate a hard crosslinked polymeric solid. The polymeric solid is then charred to partially burn off the organic material followed by comminution of the carbonized solid into powder. This powder is calcined at 700° C. to form the appropriate oxide with further heating, if needed, to produce the equilibrium phase.

The solutions used included gadolinium citrate, samarium citrate, yttrium citrate and titanium citrate into which the desired quantity (in the range of from 0.0 mole % to 15.0 mole %) of $Ca^{2+}$, $Mg^{2+}$, $Sr^{2+}$ and $Al^{3+}$ dopants were introduced. It was noted that the citrate solutions were often viscous and it was then necessary to mix the solutions for several hours to ensure a homogeneous solution.

It is also noted that when the rare earth metal cations were initially supplied as nitrates, care was taken to remove the nitrate anions before dissolving the rare earth metal salts in the ethylene glycol and citric acid mixture by dissolution of the rare earth metal nitrates in water followed by precipitating the metal hydroxides with a concentrated ammonia solution.

Calcined powders were die-pressed at 5 kpsi, isopressed at 45 kpsi and sintered at 1600° C. for 16 h.

Electrical measurements were then performed on polycrystalline sintered compact bars approximately 2 mm×3 mm×8 mm with Pt electrodes in two probe configuration. Contributions from bulk, grain boundary, and electrodes were deconvoluted using complex impedance spectroscopy. An HP4192A impedance analyzer with a frequency range of 5 Hz to 13 MHz was used for the analysis. Measurements were made as a function of temperature (800°–1110° C. and oxygen fugacity (1–10$^{-20}$ atm) using either pre-mixed oxygen/argon or carbon dioxide/carbon monoxide mixtures. The oxygen fugacity was periodically checked with a stabilized zirconia galvanic cell.

The effects of aliovalent doping on ionic, electronic and mixed ionic and electronic conductivity (MIEC) were investigated in the rare earth titanate pyrochlore solid solution end member $Gd_2Ti_2O_7$ to evaluate the role of host lattice, dopant site and dopant-host size mismatch on electrical transport.

Figure 4:
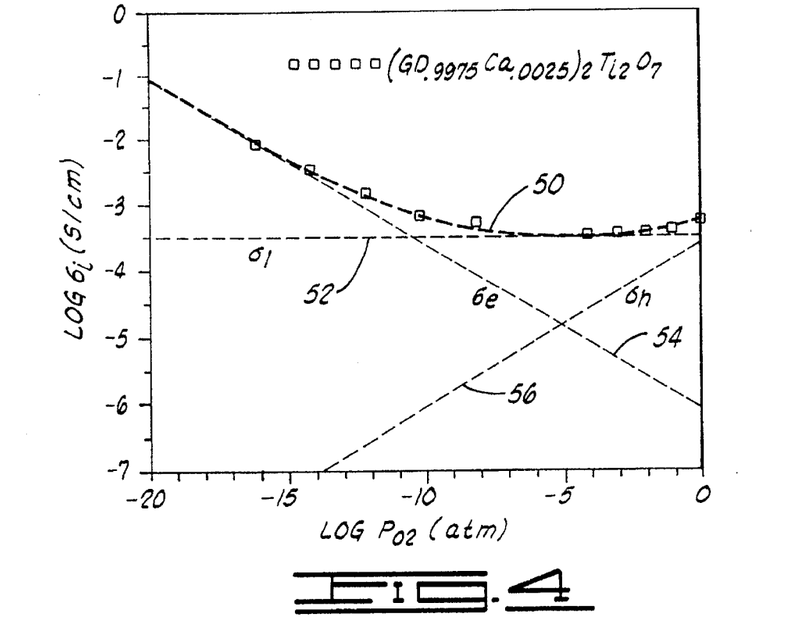
FIG. 4 is a plot of log $\sigma$ versus log $P_{O2}$ for $(Gd_{0.9975}Ca_{0.0025})_2Ti_2O_2$ at 1000° C.

FIG. 4 shows the isothermal log $\sigma$ versus log $P_{O2}$ observed for the pyrochlore composition $(Gd_{0.9975}Ca_{0.0025})_2Ti_2O_7$ at 1000° C. and is representative of $A_2Ti_2O_7$ pyrochlores where A is Sm, Gd and Y. In FIG. 4, solid line 50 is an iterative least squares minimization technique fit of the data for the total measured conductivity to defect chemistry theory and dashed lines 52, 54 and 56, respectively, show the individual contributions of $\sigma_i$, $\sigma_e$ and $\sigma_h$ where $\sigma_i$, $\sigma_e$, $\sigma_h$ respectively are the ionic, the n-type and the p-type contributions to the total measured conductivity.

Figure 5:
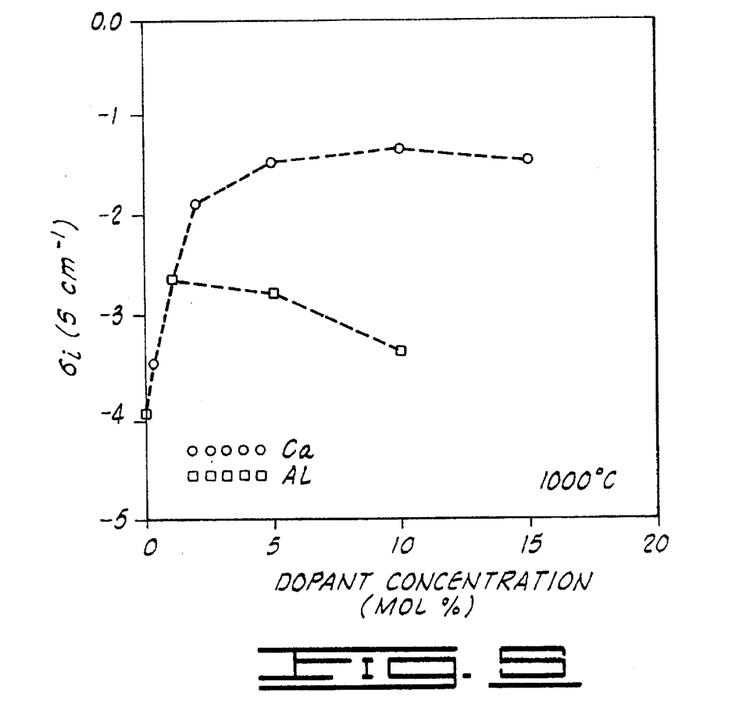
FIG. 5 is a plot of ionic conductivity as a function of $Ca^{2+}$ and $Al^{3+}$ doping in $Gd_2Ti_2O_7$ at 1000° C.
Figure 6:
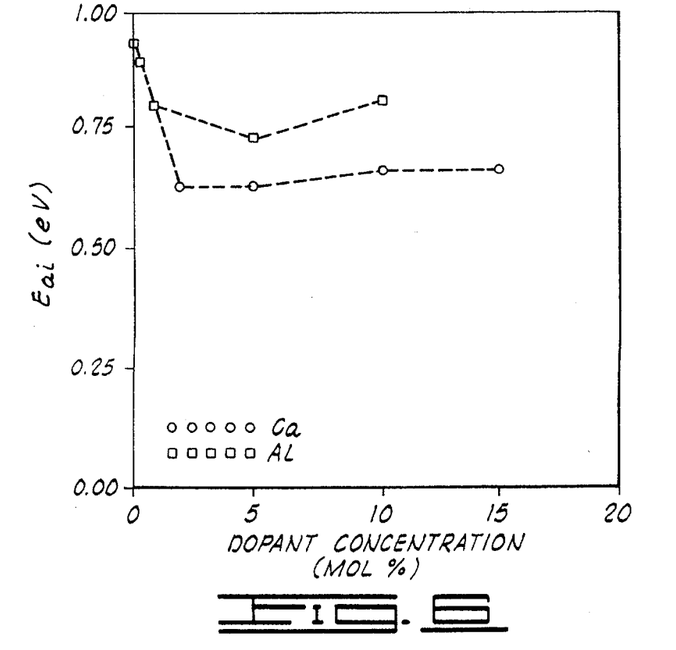
FIG. 6 is a plot of the ionic conductivity activation energy as a function of $Ca^{2+}$ and $Al^{3+}$ doping in $Gd_2Ti_2O_7$.

FIG. 5 and FIG. 6, respectively, show the ionic conductivity and corresponding activation energy for ionic conduction as a function of divalent $Ca^{2+}$ acceptor doping to partially replace $Gd^{3+}$ on the "A site" and as a function of trivalent $Al^{3+}$ acceptor doping on the $Ti^{4+}$ site. It is noted that the activation energy for ionic conduction, $E_{ai}$, is a function of dopant concentration and drops to a minimum value of 0.63 ev for 5.0 mole % Ca doping.

FIGS. 5 and 6 show that the ionic conductivity of $Gd_2Ti_2)O_7$ at 1000° C. can be increased by over 2.5 orders of magnitude by doping with divalent $Ca^{2+}$ which reduces $E_{ai}$ from 0.93 ev to 0.63 ev. For $Al^{3+}$ doping, a sharp maximum in $\sigma_i$ is observed at approximately 1 mole % Al which may be due to the limited solubility of Al on the Ti site.

Figure 7:
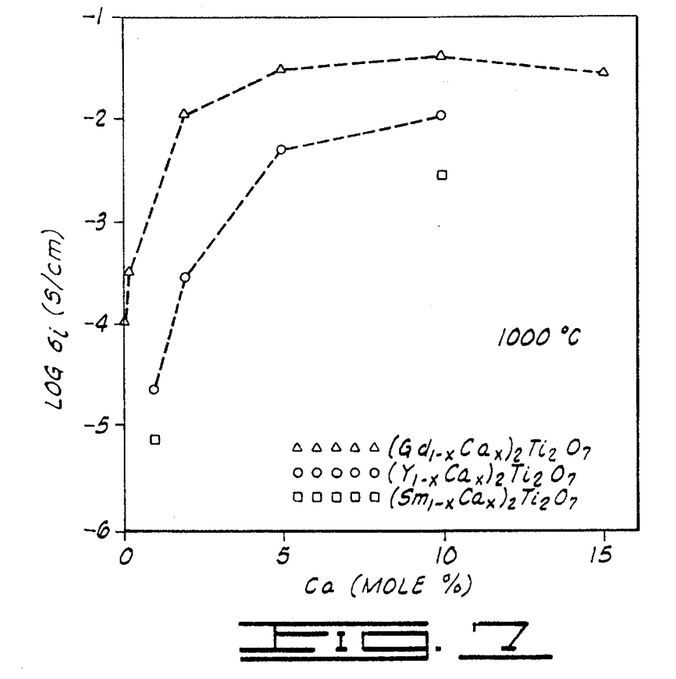
FIG. 7 is a plot of log $\sigma_i$ showing the effect of dopant chemical identity and concentration on $\sigma_i$ in samarium, gadolinium and yttrium-based rare earth titanates.

FIG. 7 shows that $Y_2Ti_2O_7$ and $Sm_2Ti_2O_7$ also have high solubilities for $Ca^{2+}$ and further demonstrates that the $Ca^{2+}$ doped gadolinium titanate has the highest ionic conductivity when compared to those of yttrium and samarium titanates having the same $Ca^{2+}$ doping levels.

Figure 8:
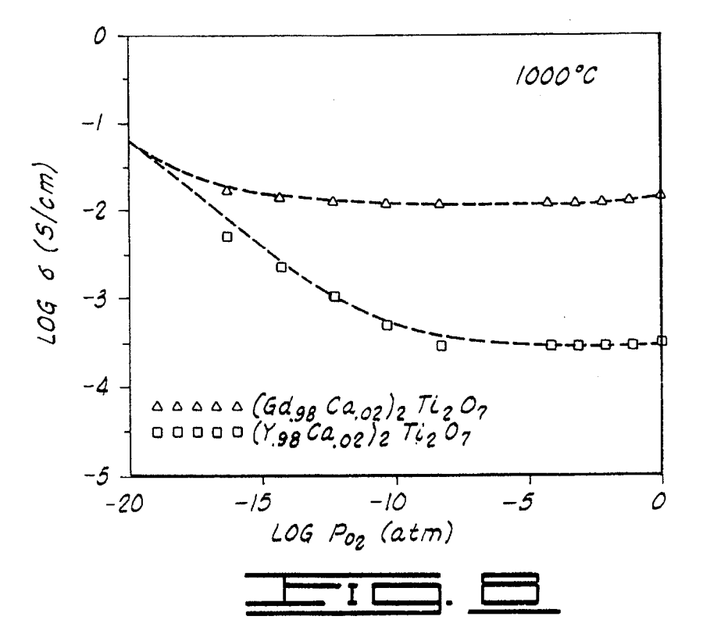
FIG. 8 is a plot showing log $\sigma$ versus log $P_{O2}$ isotherms at 1000° C. for $Ca^{2+}$ doped yttrium- and gadolinium- based titanates.
Figure 9:
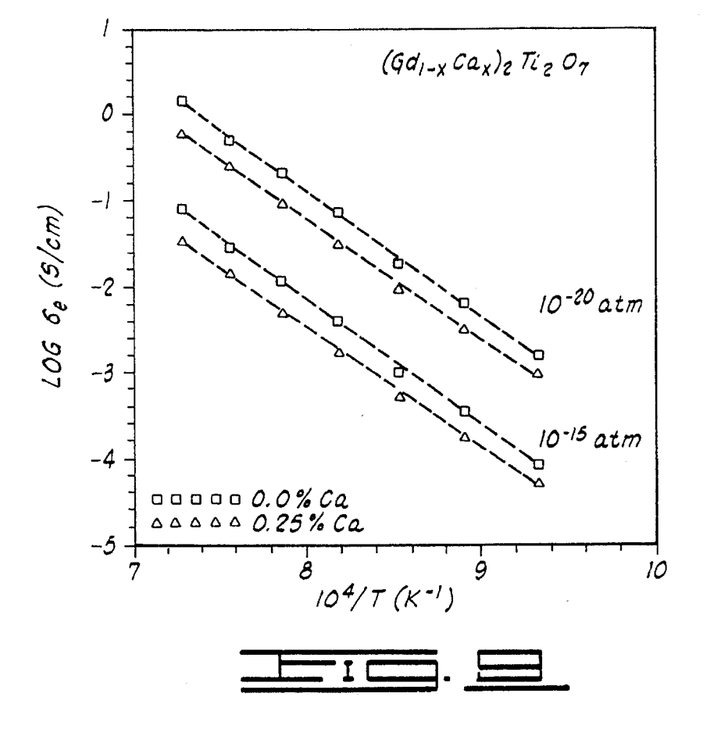
FIG. 9 is a plot of log $\sigma_e$ where $\sigma_e$ is the n-type electronic conductivity as a function of inverse temperature showing high electronic conductivity at low $P_{O2}$ in $(Gd_{1-x}Ca_x)_2Ti_2O_7$.

In FIG. 8, log $\sigma$ isotherms versus log $P_{O2}$ for $(A_{0.98}Ca_{0.02})_2Ti_2O_7$ where A is Y or Gd indicated that at high $P_{O2}$ the ionic conductivity dominates over the electronic conductivity. With decreasing $P_{O2}$, a much stronger increase in mixed ionic and electronic conductivity (MIEC) is observed in the $Y_2Ti_2O_7$ based rare earth titanate than in the $Gd_2Ti_2O_7$ based material. FIG. 9 shows the high electronic conductivity achieved in $(Gd_{1-x}Ca_x)_2Ti_2O_7$ at low $P_{O2}$.

Figure 10:
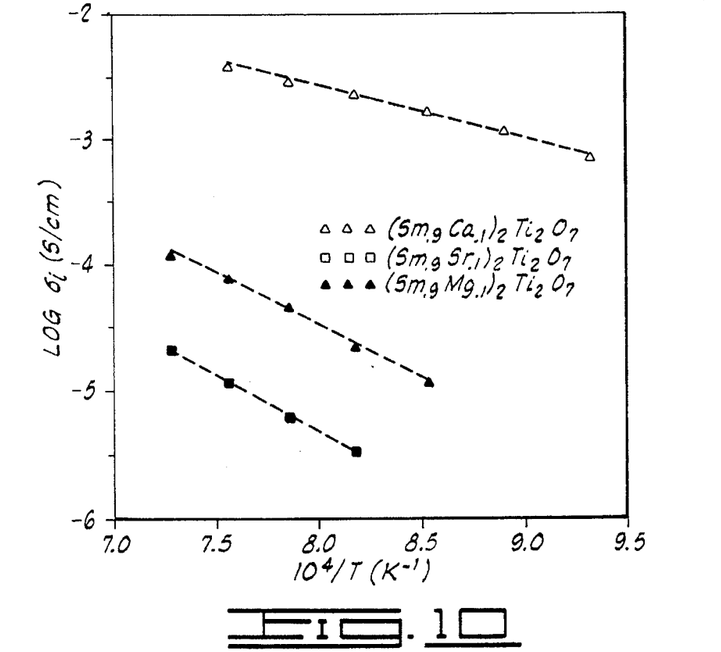
FIG. 10 is a plot of log $\sigma_i$ as a function of inverse temperature comparing the ionic conductivity of a samarium based titanate doped with divalent cations of differing cationic radii.
Figure 11:
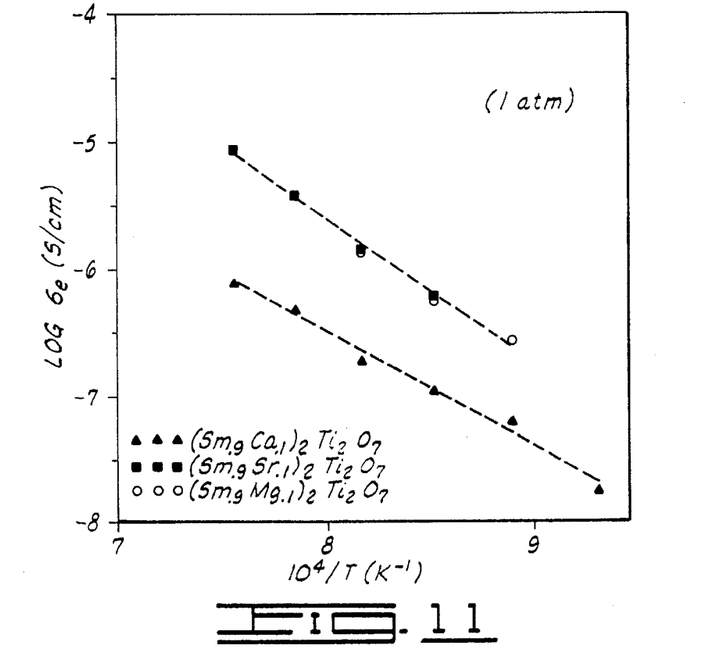
FIG. 11 is a plot of log $\sigma_e$ as a function of inverse temperature comparing the ionic conductivity of a samarium-based titanate doped with divalent cations of differing cationic radii.
Figure 12:
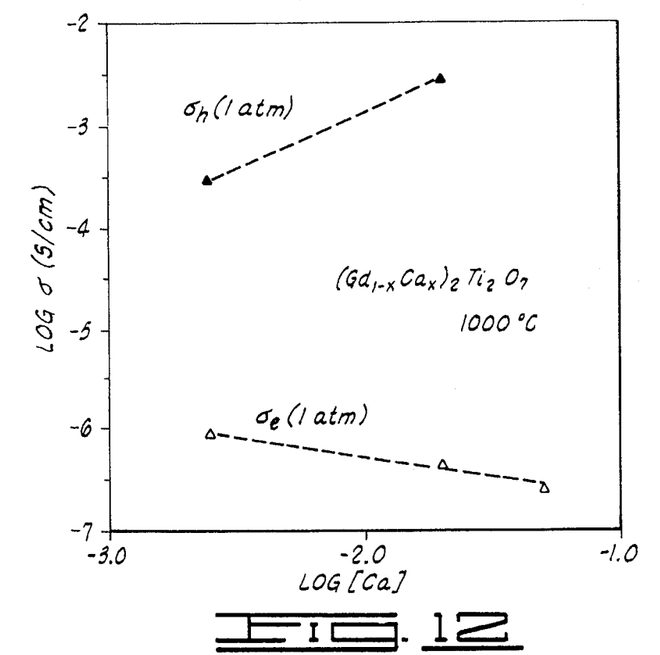
FIG. 12 is a plot showing electron and hole conductivity as a function of $Ca^{2+}$ doping in $(Gd_{1-x}Ca_x)_2Ti_2O_7$ at 1000° C.

FIG. 10 shows the temperature dependence of $\sigma_i$ for $(Sm_{0.9}R_{0.1})_2Ti_2O_7$ where R is a $Sr^{2+}$, $Ca^{2+}$ and $Mg^{2+}$ dopant which although is isovalent is characterized by variable cationic size. Between 800°–1100° C., the intermediate $Ca^{2+}$ dopant is associated with the highest ionic conductivity, due in part to the fact that the $Ca^{2+}$ cationic radius of 1.12 Angstroms is closest in size among those of the three dopants to that of $Sm^{3+}$ (1.09 Angstroms) as well as to dopant solubility and defect association effects. By contrast, as shown in FIG. 11, $Sr^{2+}$ and $Mg^{2+}$ doped compositions had higher electronic conductivities than those doped with $Ca^{2+}$. FIG. 12 shows the electron hole conductivity as a function of Ca doping in $(Gd_{1-x}Ca_x)_2Ti_2O_7$ with $\sigma_e$ and $\sigma_h$ decreasing and increasing, respectively, with increasing Ca content. At $P_{O2}=10^{-20}$ atm, $\sigma_e$ and $\sigma_h$, the p-type electronic conductivity are, respectively, increased and decreased by approximately five orders of magnitude relative to the $P_{O2}=1$ atm values.

Figure 13:
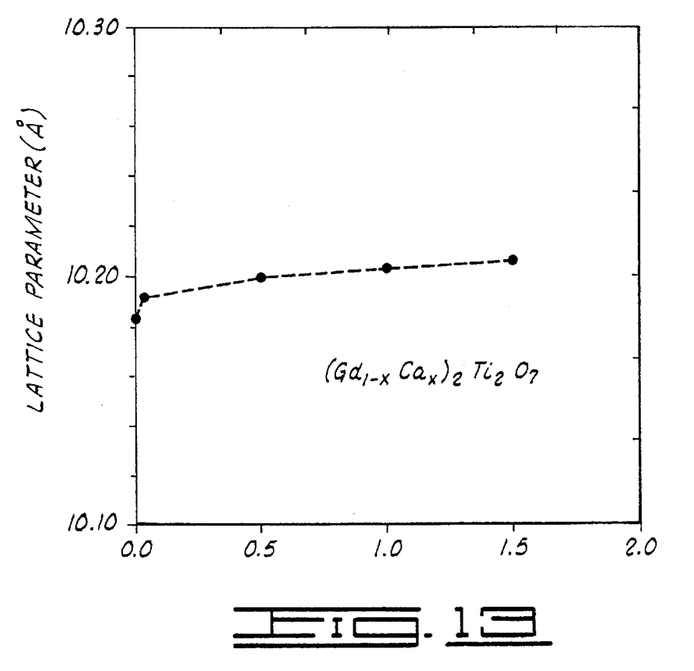
FIG. 13 is a plot of lattice parameter of $(Gd_{1-x}Ca_x)_2Ti_2O_7$ as a function of $Ca^{2+}$ doping.

FIG. 13 shows the variation in lattice parameter in the gadolinium-based rare earth titanate system with Ca doping indicating that as much as 15% A-site fraction Ca dopant can be incorporated in the gadolinium-based rare earth titanate with only minimal lattice parameter mismatch which thus minimizes mechanical strain at the interface between layers having different Ca doping levels in a monolithic electrochemical apparatus.

EXAMPLE 2

The following example is provided to indicate how a Ru doped gadolinium titanate for use as a mixed ionic electronic conductor (MIEC) electrode in an electrochemical apparatus of the invention is prepared and characterized.

Ruthenium chloride was added directly to a solution of citric acid in ethylene glycol to which acetic acid has been previously added to lower the pH to approximately 4 to yield a reddish-brown translucent stock solution which was then assayed as a next step in the "liquid-mix" process as already described.

This ruthenium citrate stock solution was then added to gadolinium citrate and titanium citrate stock solutions in proportions calculated to produce compounds of the formula $Gd_2(Ru_xTi_{1-x})_2O_7$ wherein Ru is believed to substitute on the Ti site.

The mixed solutions were then pyrolyzed to form a hardened resin, baked at 550° C. in air and calcined only to 750° C. in air. A lower calcination temperature is necessary to prevent loss of Ru through formation of $RuO_4$ which is produced at temperatures of about 800° C. to about 850° C. in oxidizing environments.

Sintered pellets of Ru-substituted gadolinium titanate were prepared by forming a thick slurry containing 2 wt % polyvinyl-alcohol, 2 wt % polyethylene glycol binder, water and powder. The slurry was dried, ground with a mortar and pestle and sieved to remove particles larger than −120 mesh. The sieved powder was then pressed uniaxially to 5 kpsi, sanded and pressed isostatically to 40 kpsi. The pressed pellets were then heated to 750° C. to remove the binder. The pressed pellets were finally sintered in a highly reducing environment, forming gas, 5% $H_2$ in 95% $N_2$, at 1600° C. for 12 hours. The highly reducing environment is need to avoid the loss of Ru through formation and chemical vapor transport of $RuO_4$. Sintered pellets were highly colored red, reddish-purple or black with darker colors associated with higher Ru contents.

The x-ray diffraction patterns from crushed pellets showed that they were the pyrochlore crystalline phase with the same structure but slightly different lattice parameter than the $Gd_2Ti_2O_7$ undoped composition.

Electrical conductivity measurements were made on the Ru-doped samples and the data deconvolved to isolate the bulk-contribution to the conductivity from grain boundary and electrode interfacial effects.

Figure 14:
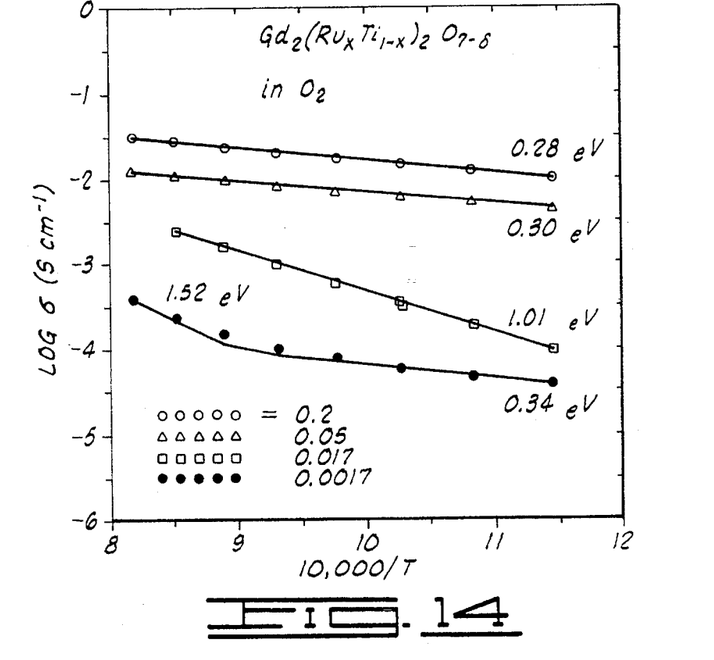
FIG. 14 is a plot of log $\sigma$ versus inverse temperature for several Ru-doped gadolinium titanate compositions.

FIG. 14 shows how samples with high Ru content ($x \geq 0.02$) exhibit high conductivities with low activation energies. Samples with lower Ru content have higher activation energies and are less conductive.

Figure 15:
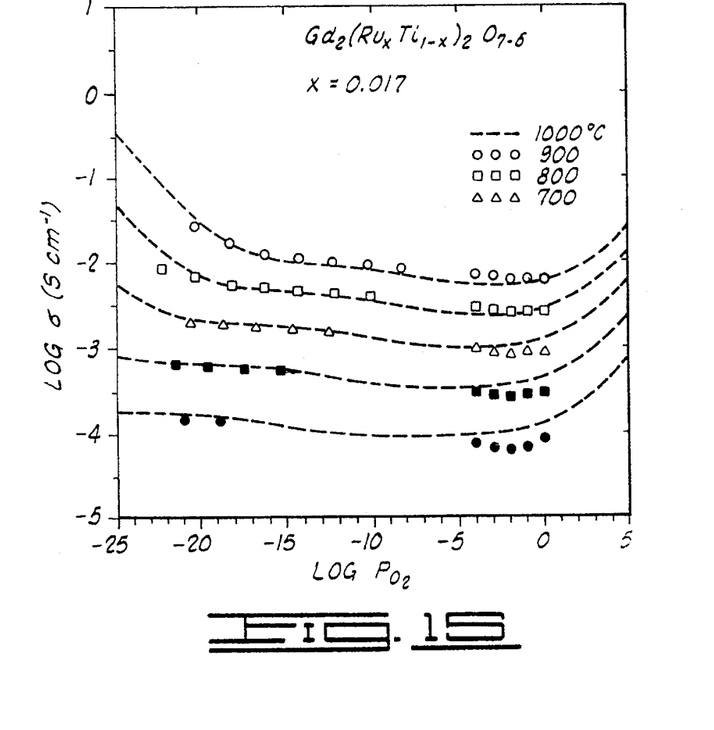
FIG. 15 is a plot of measured total conductivity for a $Gd_2(Ru_xTi_{1-x})_2O_{7-\delta}$ as a function of log $P_{O2}$ for x=0.017.

FIG. 15 shows the effect of variation in $P_{O2}$ on the measured conductivity of Ru-doped gadolinium titanate. A nearly $P_{O2}$ independent regime typically occurs in Ru doped gadolinium titantare with $x \geq 0.02$ at elevated temperatures and high $P_{O2}$ indicating that, at low concentration, Ru acts as an acceptor. The activation energies of 0.8 to 1 ev and the magnitudes of the conductivities ($\sigma = 3 \times 10^{-2}$ at 1000° C.) are typical of ionic conduction found in Ca doped gadolinium titanate. For $x \geq 0.05$, the low temperature conductivity increases by orders of magnitude and the activation energy drops to 0.2 to 0.3 ev, indicating a shift from ionic to predominantly electronic conductivity. Since this conductivity increases with decreasing $P_{O2}$, it is probably not p-type.

The implications for the use of gadolinium titanate ruthenate solid solution as a solid oxide electrode in an electrochemical apparatus are enhanced electrode kinetics due to the well known catalytic effects of Ru and the enhanced mixed ionic-electronic conductivity of the $Gd_2Ti_2O_7$—$Gd_2Ru_2O_7$ solid solution. The single phase nature of the electrode-electrolyte monolithic structure adds to the stability of the system.

More specifically, the implications for the use of gadolinium titanate ruthenate solid solution in a solid oxide fuel cell are lower operating temperatures due to the enhanced electrode kinetics and the possibility of forming thin electrolyte layers in a monolithic composite structure. Since metallic conductivity can be achieved in a $(Bi_{1-x}Gd_x)_2(Ti_{1-y}Ru_y)_2O_7$ solid solution, as well as high ionic conductivity, a fuel cell with low operating temperatures and structural and electrical compatibility can be fabricated which will lead to high energy conversion efficiency and long operating life for the electrochemical apparatus.

EXAMPLE 3

The following example is provided to show the preparation and characterization of a multilayer composite structure including two functionally different pyrochlore compositions which may be co-fired to give a structurally robust composite structure without destroying the electrical characteristics of the individual layers.

A three layer electrochemical device was fabricated from two compositions based upon $Gd_2Ti_2O_7$. The first composition, composition A, $(Gd_{0.9}Ca_{0.1})_2Ti_2O_7$ is an excellent ionic conductor ($\sigma=5\times10^{-2}$ S/cm at 1000° C.) and the second composition, composition B, $(Gd_{0.9975}Ca_{0.0025})_2Ti_2)O_7$ is a mixed ionic-electronic conductor with an ionic conductivity of approximately $3\times10^{-4}$ S/cm at 1000° C. and electronic conductivity of approximately $10^{-2}$ S/cm at 1000° C. and $P_{O2}=10^{-16}$ atm.

The composite structure was fabricated by successively filling a steel die of diameter ¾" with powders of compositions A, B and A. Amounts of 1 gm composition A and 2.5 gm composition B were used. Subsequent to adding each of the sequential powder layers, a piston was inserted and pressed by hand to flatten the previous layer. The composite was then further compacted in a uniaxial press at 5 kpsi.

After removal from the die, the pellet was isostatically pressed at 50 kpsi followed by sintering in air at 1600° C. for 18 hours. The specimen was then furnace cooled to room temperature. Sintering yielded a high density pellet characterized by greater then 90% theoretical density with two thin outer regions distinguished only by a yellow tint as compared to the white interior. No cracks or delamination of the layers as observed.

The layered composite was electrically characterized to demonstrate that the respective layers retained their individual electrical characteristics. A core drill was used to bore ⅛" diameter holes through the outer layers to enable electrical contact to be made to the inner as well as to the outer layers of the multilayer composite as shown schematically in an elevation view in FIG. 16 and in cross-section in FIG. 17. Four contacts, 60, 62, 64 and 66 allow measurement of the electrical properties of all layers. Contacts 60 and 62 allow measurement of the overall composite 68. Contacts 64 and 66 allow measurement of inner layer 70. Contacts 60 and 64 and 62 and 66 allow measurement of outer layers 72 and 74, respectively.

Figure 16:
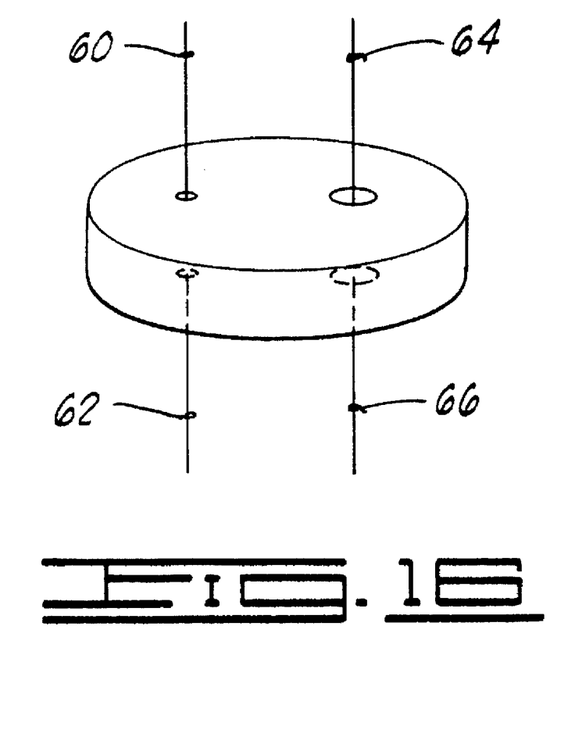
FIG. 16 is a schematic elevation view of a multilayer composite electrochemical apparatus of the invention.
Figure 17:
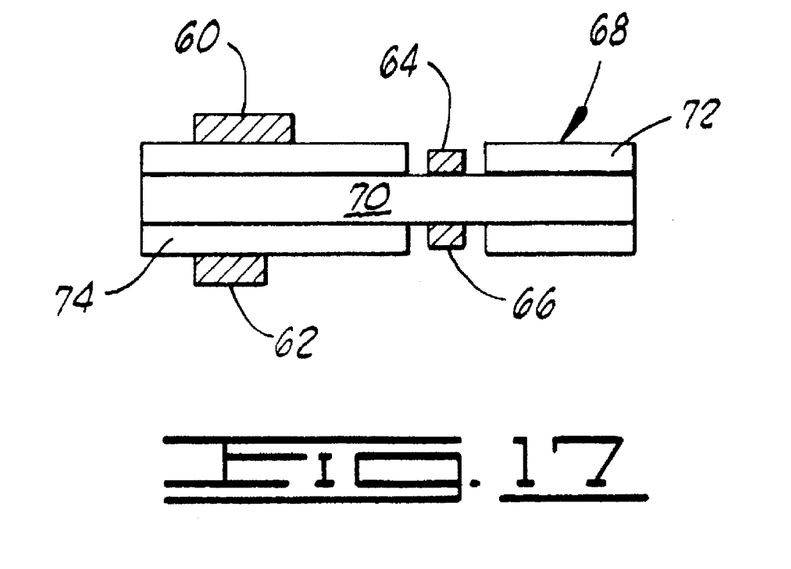
FIG. 17 is a schematic cross-section of a multilayer composite electrochemical apparatus of the invention.

Using AC complex impedance methods, in $P_{O2}=1$ atm, at 900° C., $R_{60-62}=83$ k$\Omega$: $R_{64-66}=85$ k$\Omega$; $R_{60-64}=1.8$ k$\Omega$. As expected based on the layer individual properties, layers 72 and 74 were much less resistive than layer 70 and therefore, within experimental error, the overall resistance of the multilayer composite was equal to that of the most resistive layer 70.

Additional measurements conducted at $P_{O2}=10^{-4}$ atm and at 900° C. gave $R_{60-62}=21$ k$\Omega$; $R_{64-66}=22$ k$\Omega$ and $R_{60-64}=1.8$ k$\Omega$. As expected based upon the individual properties of the layers, layers 72 and 74 being predominantly ionically conductive exhibited no $P_{O2}$ dependence, while layer 70 showed the decrease in resistance characteristic of a mixed ionic electronic conductor where n-type conductivity increases with decreasing $P_{O2}$.

What is claimed is:

1. A method for fabricating an electrochemical device comprising:

(1) depositing a solid electrolyte characterized by a solid electrolyte crystalline phase and solid electrolyte composition on a substrate using a deposition technique selected from the group consisting of chemical vapor deposition (CVD), molecular beam epitaxy (MBE) and sol-gel dipping/spinning and sintering; and (2) depositing by using a deposition technique selected from the group consisting of chemical vapor deposition (CVD), molecular beam epitaxy (MBE) and Sol-gel dipping/spinning and sintering a solid electrode characterized by a solid electrode crystalline phase that is the same as said solid electrolyte crystalline phase and by a solid electrode composition so that said solid electrolyte is in electrical contact with said solid electrode.

2. The method of claim 1 further comprising a step (3) of placing said solid electrode in electrical contact with a solid interconnect to electrically connect said electrochemical device with another electrochemical device.

3. The method of claim 2 further comprising a step (4) of depositing a compositionally graded layer between and in electrical contact with said solid electrode and said interconnect.

4. The method of claim 1 further comprising a step of preparing a graded layer between said solid electrode and said solid electrolyte wherein said graded layer is characterized by a spatially varying composition by sequentially preparing precursor layers of varying composition by repeating steps of sol-gel dipping/spinning solutions having correspondingly varying compositions onto said solid electrolyte followed by a single sintering step.

5. The method of claim 1 further comprising a step of preparing a graded layer between said solid electrode and said solid electrolyte wherein said graded layer is characterized by a spatially varying composition by varying with time partial pressure of a constituent using a deposition technique selected from the group consisting of electrochemical vapor deposition (EVD), chemical vapor deposition (CVD) and molecular beam epitaxy (MBE).

6. The method of claim 1 further including a step of preparing said solid electrolyte characterized by a first chemical composition formula cation and preparing a graded region having a spatially varying composition produced by adding a dopant cation which partially replaces said formula cation so that said dopant cation increases in concentration with displacement from said electrolyte to said electrode.

7. The method of claim 1 wherein said solid electrolyte is a single crystal solid electrolyte and further including a step of producing a graded region having a spatially graded composition on said electrolyte by depositing a layer characterized by said electrode composition on said single crystal solid electrolyte to form a single crystal solid electrolyte-solid electrode structure and heating said single crystal solid electrolyte-solid electrode structure so that interdiffusion between said single crystal solid electrolyte and said layer occurs to form said graded region.

8. The method of claim 1 wherein said solid electrolyte is a polycrystalline solid electrolyte and further including a step of producing a graded region having a spatially graded composition on said polycrystalline electrolyte by depositing a layer characterized by said electrode composition on said polycrystalline solid electrolyte to form a polycrystalline solid electrolyte-solid electrode structure and heating said polycrystalline solid electrolyte-solid electrode structure so that interdiffusion between said polycrystalline solid electrolyte and said layer occurs to form said graded region.

9. The method of claim 1 further including steps of masking, deposition and etching to define a precise topography of active regions including electrolyte, anode, cathode, interconnect, metallization and encapsulation regions.

10. The method of claim 1 wherein said substrate is a solid electrode.

11. The method of claim 1 wherein said substrate is a single crystal solid electrode and further including a step of producing a graded region having a spatially graded composition on said electrode by depositing a layer characterized by said electrolyte composition on said single crystal solid electrode to form a single crystal solid electrolyte-solid electrode structure and heating said single crystal solid electrolyte-solid electrode structure so that interdiffusion between said single crystal solid electrolyte and said layer occurs to form said graded region.

12. The method of claim 1 wherein said substrate is a polycrystalline solid electrode and further including a step of producing a graded region having a spatially graded composition on said polycrystalline solid electrode by depositing a layer characterized by said electrolyte composition on said polycrystalline solid electrode to form a polycrystalline solid electrolyte-solid electrode structure and heating said polycrystalline solid electrolyte-solid electrode structure so that interdiffusion between said polycrystalline solid electrolyte and said layer occurs to form said graded region.

13. The method of claim 1 wherein said crystalline phase is a rare earth titanate pyrochlore and said deposition technique is chemical vapor deposition (CVD) and further including a step of providing a chemical vapor deposition precursor gas selected from the group consisting of $CaCl_2$, $GdCl_3$, $TiCl_4$, $ZrCl_4$ and $O_2/H_2O$ and mixtures thereof.

14. A method for fabricating an electrochemical apparatus comprising:
(1) preparing a solid electrolyte made of solid electrolyte material characterized by a solid electrolyte crystalline phase; and
(2) preparing a solid electrode made of solid electrode material characterized by a solid electrode crystalline phase which is the same as said solid electrolyte crystalline phase and in electrical contact with said solid electrolyte wherein said solid electrolyte and said solid electrode are selected from the group of materials consisting of a solid solution having a pyrochlore crystal structure and characterized by the formula $A_2B_2O_{7-\delta}$ wherein A is an A cation of an element selected from the group consisting of Sm, Gd, Ho, Pr, Nd, Pm, Eu, Tb, Dy, Er, Tm, Yb, Lu, Y, Sc, Bi, Pb and mixtures thereof and B is a cation selected from the group consisting of Al, Cr, Mn, Fe, Co, Ni, Cu, In, Ti, Hf, Sn, Pb, Ru, Os, Ir, Rh, Pd, Pt, Sb, V, Nb, Ta, Mo, W and mixtures thereof and wherein $\delta$ indicates the extent of oxygen deficiency or excess relative to seven oxygens per formula unit and is in the range of from about ±0.001 to about ±0.3; a solid solution having a perovskite crystal structure and characterized by the formula $ABO_{3-\delta}$ wherein A is an A cation of an element selected from the group consisting of Pb and Bi and mixtures thereof, B is selected from the group consisting of Sr, Ti, Zr, In, Mg, Zn, Sc, Ta, Nb and Al and mixtures thereof and $\delta$ is in the range of from 0 to about 3; and a solid solution having a fluorite crystal structure and characterized by the formula $A_{1-j}D_jO_{2+\epsilon}$ wherein A is an A cation of an element selected from the group consisting of Ce, Pr, Hf and Th and mixtures thereof, and D is a D cation of an element selected from the group consisting of Pr and Tb and mixtures thereof and $\epsilon$ indicates the extent of oxygen deficiency or excess relative to two oxygens per formula unit and $\epsilon$ is in the range of from about 0 to about ±0.3.

15. The method of claim 14 wherein at least one of said steps of preparing is performed using a deposition technique selected from the group consisting of electrochemical vapor deposition (EVD), chemical vapor deposition (CVD), molecular beam epitaxy (MBE), and sol-gel dipping/spinning and sintering.

16. A method for fabricating an electrochemical device comprising:
(1) depositing a rare earth titanate pyrochlore solid electrolyte characterized by a solid electrolyte crystalline phase on a substrate using an electrochemical vapor deposition (EVD) technique; and
(2) depositing a solid electrode characterized by a solid electrode crystalline phase that is the same as said solid electrolyte crystalline phase so that said solid electrolyte is in electrical contact with said solid electrode.

17. The method of claim 16 further including a step of providing an electrochemical vapor deposition gaseous precursor selected from the group consisting of $CaCl_2$, $GdCl_3$, $TiCl_4$, $ZrCl_4$ and $O_2/H_2O$ and mixtures thereof.

18. The method of claim 16 further comprising a step of placing said solid electrode in electrical contact with a solid interconnect to electrically connect said electrochemical device with another electrochemical device.

19. The method of claim 16 further comprising a step of depositing a compositionally graded layer between and in electrical contact with said solid electrode and said interconnect.

20. A method for fabricating an electrochemical device comprising:

(1) providing a solid electrolyte characterized by a solid electrolyte crystalline phase; and (2) depositing a rare earth titanate pyrochlore solid electrode characterized by a solid electrode crystalline phase that is the same as said solid electrolyte crystalline phase using an electrochemical vapor deposition (EVD) technique so that said solid electrolyte is in electrical contact with said solid electrode.

21. The method of claim 20 further including a step of providing an electrochemical vapor deposition gaseous precursor selected from the group consisting of $CaCl_2$, $GdCl_3$, $TiCl_4$, $ZrCl_4$ and $O_2/H_2O$ and mixtures thereof.

22. The method of claim 20 further comprising a step of placing said solid electrode in electrical contact with a solid interconnect to electrically connect said electrochemical device with another electrochemical device.

23. The method of claim 20 further comprising a step of depositing a compositionally graded layer between and in electrical contact with said solid electrode and said interconnect.

24. A method for fabricating an electrochemical device comprising:

(1) selecting a solid solution including a first solid solution chemical composition characterized by predominantly ionic conductivity and a second solid solution chemical composition different from said first solid solution chemical composition and characterized by predominantly electronic conductivity and a third solid solution chemical composition intermediate between said first solid solution chemical composition and said second solid solution chemical composition and wherein said first, second, and third solid solution chemical compositions are characterized by a same solid solution crystalline phase;

(2) preparing an electrolyte ceramic powder having said first solid solution chemical composition;

(3) preparing an electrode ceramic powder having said second solid solution chemical composition;

(4) preparing an intermediate ceramic powder having said third solid solution chemical composition;

(5) forming an electrolyte layer from said electrolyte ceramic powder;

(6) forming an electrode layer from said electrode ceramic powder;

(7) forming an intermediate layer from said intermediate ceramic powder;

(8) assembling said electrolyte layer, said electrode layer and said intermediate layer so that said intermediate layer intervenes between said electrolyte layer and said electrode layer to form a green composite body; and (9) sintering said green composite body to form said electrochemical device.

* * * * *

UNITED STATES PATENT AND TRADEMARK OFFICE
CERTIFICATE OF CORRECTION

PATENT NO. : 5,509,189
DATED : April 23, 1996
INVENTOR(S) : Harry L. Tuller et al.

Page 1 of 2

It is certified that error appears in the above-identified patent and that said Letters Patent is hereby corrected as shown below:

Column 1, line 66: change "ionicelectronic" to --ionic-electronic--.
Column 3, line 29: change "$Ca^{=+}$" to --$Ca^{2+}$--.
Column 5, line 16: change "Tl" to --Tl--.
Column 5, line 21: change "Tl" to --Tl--.
Column 6, line 31: change "$AB_4O_{3-\delta}$" to --$ABO_{3-\delta}$--.
Column 6, line 42: change "on" to --or--.
Column 6, line 52: change "$Ta_{5+}$" to --$Ta^{5+}$--.
Column 6, line 61: change "$A_3B_2BO_8$" to -- $A_3B_2B'O_8$ --.
Column 6, line 62: change "$Ba_3\{In_2(Zr_{1-2k}Tik2)\}O_8$" to --$Ba_3\{In_2(Zr_{1-k'}Ti_{k'})\}O_8$--.
Column 6, line 63: change "wherein" to --where k'--.
Column 6, line 63: change "B", to --B'--.
Column 6, line 63: change "$(Ca_2Y)(Fe_{1-k}Alk3)O_8$" to --$(Ca_2Y)(Fe_{1-k}Al_k)_3O_8$--.

UNITED STATES PATENT AND TRADEMARK OFFICE
CERTIFICATE OF CORRECTION

PATENT NO. : 5,509,189
DATED : April 23, 1996
INVENTOR(S) : Harry L. Tuller et al.

It is certified that error appears in the above-identified patent and that said Letters Patent is hereby corrected as shown below:

Column 6, line 64: change "$(Ca_3Fe_2Ti)O_8$" to --$Ca_3(Fe_2Ti)O_9$--.
Column 6, line 65: change "$(La_{1-j}Sr_j)(Al_{1-k}Mnk)O_3$" to --$(La_{1-j}Sr_j)(Al_{1-k}Mn_k)O_3$--.
Column 11, line 63: change "$(Gd_{1-x}Ca_2)_2Ti_2O_7$" to --$(Gd_{1-x}Ca_x)_2Ti_2O_7$--.
Column 12, line 9: change "$(Gd_{1-x}xCa_x)_2Ti_2O_7$" to --$(Gd_{1-x}Ca_x)_2Ti_2O_7$--.
Column 13, line 12: change "titantare" to --titanate--.
Column 13, line 12: change "$x \geq 0.02$" to --$x \leq 0.02$--.

Column 14, claim 1, line 49: change "Sol-gel" to --sol-gel--.

Signed and Sealed this

Twenty-seventh Day of August, 1996

Attest:

BRUCE LEHMAN

*Attesting Officer*    *Commissioner of Patents and Trademarks*